(12) United States Patent
Fuergut et al.

(10) Patent No.: US 12,218,030 B2
(45) Date of Patent: Feb. 4, 2025

(54) ELECTRONIC MODULE COMPRISING A SEMICONDUCTOR PACKAGE WITH INTEGRATED CLIP AND FASTENING ELEMENT

(71) Applicant: Infineon Technologies Austria AG, Villach (AT)

(72) Inventors: Edward Fuergut, Dasing (DE); Peter Eibl, Maxhuette/Pirkensee (DE); Horst Groeninger, Maxhuette-Haidhof (DE); Martin Gruber, Schwandorf (DE); Christian Kasztelan, Penang (MY); Philipp Seng, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/816,561

(22) Filed: Mar. 12, 2020

(65) Prior Publication Data

US 2020/0294885 A1    Sep. 17, 2020

(30) Foreign Application Priority Data

Mar. 15, 2019    (EP) .................................... 19163200

(51) Int. Cl.
*H01L 23/40*    (2006.01)
*H01L 21/56*    (2006.01)
(Continued)

(52) U.S. Cl.
CPC ........ *H01L 23/4006* (2013.01); *H01L 21/565* (2013.01); *H01L 23/4093* (2013.01);
(Continued)

(58) Field of Classification Search
CPC ............ H01L 23/4006; H01L 23/4093; H01L 23/49503; H01L 23/49537;
(Continued)

(56) References Cited

U.S. PATENT DOCUMENTS 4,259,685 A     3/1981  Romano
4,878,108 A  *  10/1989 Phelps, Jr. .......... H01L 23/4006
                                                 257/713
(Continued)

FOREIGN PATENT DOCUMENTS

DE          7906405 U1      7/1979
DE          3440334 C2  *  12/1992
(Continued)

OTHER PUBLICATIONS

Muench, Heinz-Dieter, DE-3440334-C2, Machine Translation (Year: 1992).*
(Continued)

*Primary Examiner* — Andres Munoz
(74) *Attorney, Agent, or Firm* — Murphy, Bilak & Homiller, PLLC (57) ABSTRACT

An electronic module includes a semiconductor package, and a clip connected to the semiconductor package. The clip is connected to or includes at least one fastening element which is configured to make a connection to an external heat sink.

2 Claims, 9 Drawing Sheets

(51) Int. Cl.
*H01L 23/00* (2006.01)
*H01L 23/495* (2006.01)
*H01L 25/11* (2006.01)

(52) U.S. Cl.
CPC .. *H01L 23/49503* (2013.01); *H01L 23/49537* (2013.01); *H01L 24/83* (2013.01); *H01L 25/115* (2013.01); *H01L 2023/4031* (2013.01); *H01L 2023/405* (2013.01); *H01L 2023/4081* (2013.01); *H01L 2023/4087* (2013.01); *H01L 24/32* (2013.01); *H01L 2224/32245* (2013.01)

(58) Field of Classification Search
CPC ......... H01L 23/49548; H01L 23/49562; H01L 21/565; H01L 21/50; H01L 24/83; H01L 24/32; H01L 25/115; H01L 2023/4031; H01L 2023/405; H01L 2023/4081; H01L 2023/4087; H01L 2224/32245
See application file for complete search history.

(56) References Cited

U.S. PATENT DOCUMENTS

| | | | | |
|---|---|---|---|---|
| 5,179,506 A | * | 1/1993 | Corbett | H01L 23/4093 257/E23.086 |
| 5,237,485 A | | 8/1993 | Cognetti De Martiis et al. | |
| 5,466,970 A | | 11/1995 | Smithers | |
| 5,592,021 A | * | 1/1997 | Meschter | H01L 23/4006 257/726 |
| 5,834,842 A | * | 11/1998 | Majumdar | H01L 23/3107 257/E23.047 |
| 5,910,885 A | | 6/1999 | Gulachenski et al. | |
| 6,587,344 B1 | * | 7/2003 | Ross | H01L 21/4882 165/185 |
| 8,664,754 B2 | * | 3/2014 | Cho | H01L 23/49524 257/784 |
| 2008/0158822 A1 | * | 7/2008 | Stolze | H01L 23/4006 257/E23.084 |
| 2009/0147480 A1 | * | 6/2009 | Lee | H01L 23/4093 361/702 |
| 2018/0337160 A1 | * | 11/2018 | Drab | H01L 21/561 |
| 2020/0294885 A1 | * | 9/2020 | Fuergut | H01L 23/4006 |

FOREIGN PATENT DOCUMENTS

| | | | |
|---|---|---|---|
| DE | 4324210 A1 | | 10/1995 |
| JP | S58206143 A | | 12/1983 |
| JP | S63266858 A | | 11/1988 |
| JP | H07302867 A | | 11/1995 |
| JP | 2001227513 A | * | 8/2001 |
| JP | 2002314014 A | * | 10/2002 |
| JP | 2004087552 A | | 3/2004 |
| JP | 2010186931 A | | 8/2010 |

OTHER PUBLICATIONS

Miura Shinsuke, JP-2001227513-A, Machine Translation (Year: 2001).*

Mita Rikitaro, JP-2002314014-A, machine translation. (Year: 2002).*

* cited by examiner

ELECTRONIC MODULE COMPRISING A SEMICONDUCTOR PACKAGE WITH INTEGRATED CLIP AND FASTENING ELEMENT

TECHNICAL FIELD

The present disclosure is related to an electronic module, in particular to an electronic power module, and to a method for fabricating an electronic module. The electronic module may comprise a semiconductor package with an integrated clip and fastening element for connecting the semiconductor package to an external heatsink.

BACKGROUND

During operation an electronic module comprising a semiconductor die may produce heat which may have to be dissipated through one or more designated thermal pathways. A semiconductor power package is usually mounted onto a heatsink by use of screws or clips or their combination. The packages are in general isolated from the heatsink with an elastic insulation layer in form of a foil or an insulation layer integrated into the package. The thermal throughput of such insulation layers highly depends on the mounting pressure coming from the screw or clip. While clips have a limited pressure range, screw assembly leads to an inhomogeneous mounting pressure distribution. When using a screw and washer the mounting pressure is higher around the package mounting hole but not in the region above the semiconductor die. The heat dissipation is strongly related to the mounting pressure all over the insulation layer over the complete product life time. Therefore a desire exists after an optimized way of mounting a semiconductor package to a heatsink.

It may be desirable to reduce a thermal resistance between the semiconductor die and the heat dissipation means in order to improve a heat dissipation capability of the electronic module.

SUMMARY

A first aspect of the present disclosure is related to an electronic module, comprising a semiconductor package, a clip connected to the semiconductor package and connected to or comprising at least one fastening element.

A second aspect of the present disclosure is related to a method for fabricating an electronic module, the method comprising providing a leadframe comprising a die pad, attaching a semiconductor die to the die pad, providing a clip, and encapsulating the die pad, the semiconductor die, and the clip with an encapsulant.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Devices or semiconductor packages containing semiconductor dies are described below. The semiconductor dies may be of different types, may be manufactured by different technologies and may include for example integrated electrical, electro-optical or electro-mechanical circuits and/or passives. The semiconductor dies may, for example, be designed as logic integrated circuits, analog integrated circuits, mixed signal integrated circuits, power integrated circuits, memory circuits or integrated passives. They may include control circuits, microprocessors or microelectromechanical components. Further, they may be configured as power semiconductor dies, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. In particular, semiconductor dies having a vertical structure may be involved, that is to say that the semiconductor dies may be fabricated in such a way that electric currents can flow in a direction perpendicular to the main faces of the semiconductor dies. A semiconductor die having a vertical structure may have contact elements in particular on its two main faces, that is to say on its top side and bottom side. In particular, power semiconductor dies may have a vertical structure. By way of example, the source electrode and gate electrode of a power MOSFET may be situated on one main face, while the drain electrode of the power MOSFET is arranged on the other main face. Furthermore, the electronic modules described below may include integrated circuits to control the integrated circuits of other semiconductor dies, for example the integrated circuits of power semiconductor dies. The semiconductor dies can be manufactured on the basis of a specific semiconductor material, for example Si, SiC, SiGe, GaAs, GaN, AlGaAs, but can also manufactured on the basis of any other semiconductor material and, furthermore, may contain inorganic and/or organic materials that are not semiconductors, such as for example insulators, plastics or metals.

The various examples of an electronic module described below may include external contact elements. The external contact elements may represent the external terminals of the semiconductor package. They may be accessible from outside the package and may thus allow electrical contact to be made with the semiconductor dies(s) from outside the package. Furthermore, the external contact elements may be thermally conductive and may serve as heat sinks for dissipating at least part of the heat generated by the semiconductor die. The external contact elements may be part of a leadframe, in particular a Cu leadframe. The leadframe may also contain the die pad as a carrier for the semiconductor die. The semiconductor package may also contain a DCB (direct bonded copper), AMB (active metal braze) or IMS (insulated metal substrate).

The semiconductor package of the electronic module includes an encapsulant. The encapsulant may be a dielectric material and may be made of any appropriate duroplastic, thermoplastic or thermosetting material or laminate (prepreg) and may be made by molding. The encapsulant may contain filler materials. After its deposition, the encapsulant may be only partially hardened and may be completely hardened after application of energy (e.g. heat, UV light, etc.) to form an encapsulant. Various techniques may be employed to apply the encapsulant as, for example, transfer molding, compression molding, injection molding, dispensing, laminating, glob top, or casting. The encapsulant may comprise a host material, e.g. a resin matrix. Any such kind of material can in addition be filled with a filler material configured to improve a thermal conductivity of the host material. The filler material may comprise particles of one or more of $SiO_2$, $Al_2O_3$, AlN, $Si_3N_4$, BN, or diamond. The encapsulant may comprise a thermal conductivity of >1 W/mK, more specifically >2 W/mK, more specifically >3 W/mK, more specifically >5 W/mK.

The electronic module of the present disclosure may comprise an insulation layer. The insulation layer may comprise one or more of a resin matrix material, a thermoset material, an epoxy, a silicone, a thermal interface material, a thermoplast, a thermal adhesive, a thermoplast, or a thermal interface material (TIM), or a phase change material. Any such kind of materials can in addition be filled with a filler material configured to improve a thermal conductivity of the host material. The filler material may comprise particles of one or more of $SiO_2$, $Al_2O_3$, AlN, $Si_3N_4$, BN, or diamond. The insulation layer may comprise a thermal conductivity of >1 W/mK, more specifically >2 W/mK, more specifically >3 W/mK, more specifically >5 W/mK.

Figure 1:
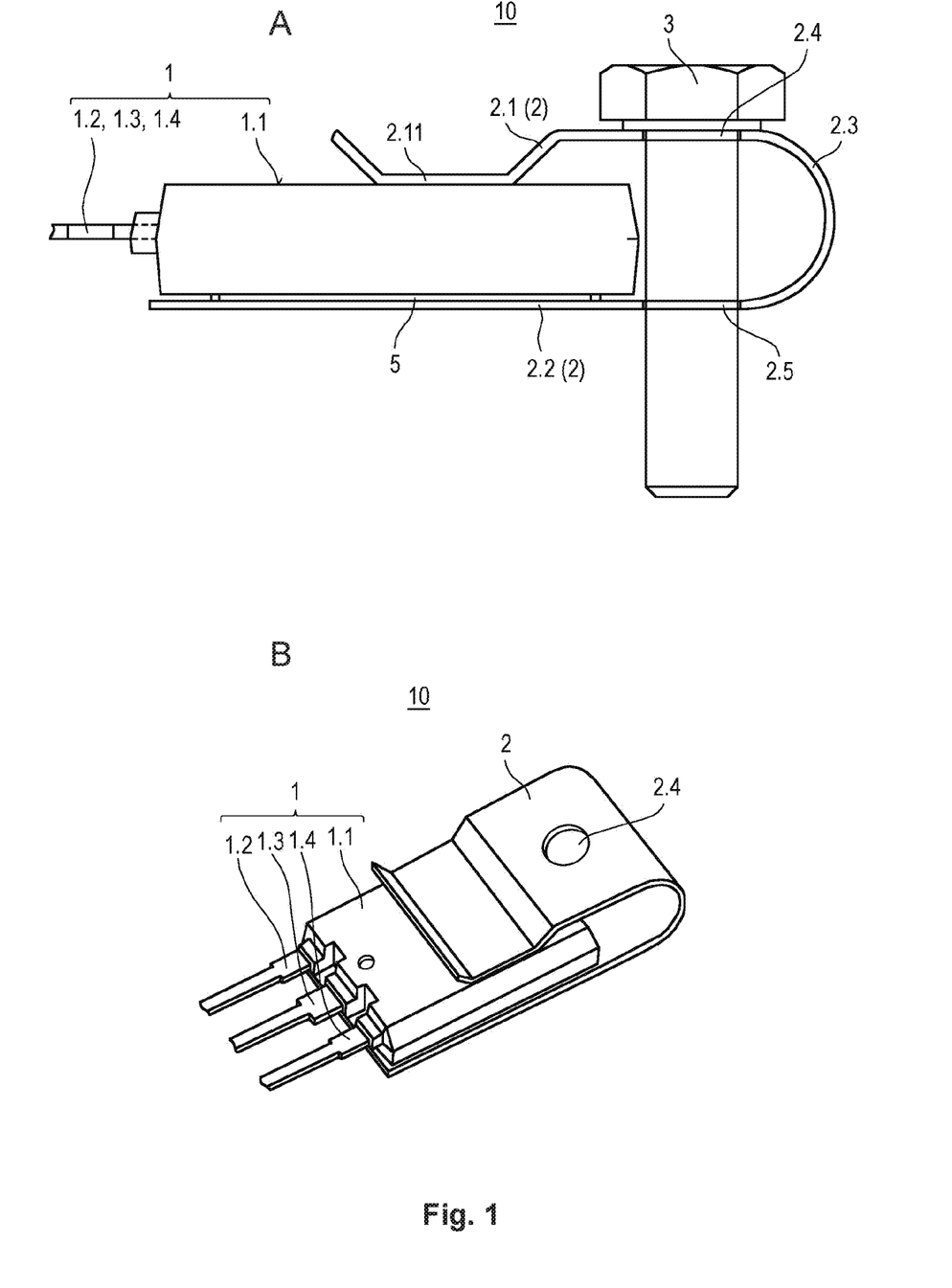
FIG. 1 shows a schematic cross-sectional side view (A) and a perspective view (B) of an example of an electronic module in which example the clip extends underneath the semiconductor package and thereby fulfills an additional protection function for the TIM layer applied to the semiconductor package.

FIG. 1 shows a schematic cross-sectional side view (A) and a perspective view (B) of an electronic module according to an example. The electronic module 10 of FIG. 1 comprises a semiconductor package 1, a clip 2 connected to the semiconductor package 1, and a screw 3 connected to the clip 2. Accordingly, in this example the fastening element is given by a screw 3. Other types of fastening elements will be shown and described in further example below. In particular, many types of screws can be used like, for example, cavity screws or screws which contain an adhesive which is to be applied onto all turns of the thread. Also an additional washer can be inserted underneath the head of the screw. In general the fastening element is configured to connect itself and thereby also the semiconductor package 1 and the clip 2 to an external heatsink.

The clip 2 can, for example, be made of steel, in particular spring steel which may contain admixtures of one more other elements, in particular metal elements like copper or aluminum. The clip 2 can be connected to the semiconductor package 1 by, for example, soldering, bonding or gluing. The clip may also comprise one or more additional layers on one or both of its main surfaces. Such layers may be configured to enhance the thermal conductance to the package or the heatsink. In particular such layers can be made of a thermal interface material (TIM).

The semiconductor package 1 as depicted in FIG. 1 is an example of a transistor outline (TO) package. The semiconductor package 1 comprises a die pad (not shown) having a semiconductor die disposed thereon (not shown). The semiconductor package 1 further comprises three parallel external leads 1.2, 1.3, and 1.4. The external leads 1.2 to 1.4 and the die pad can be part of a leadframe. The semiconductor package 1 further comprises an encapsulant 1.1 embedding the die pad, the semiconductor die and the inner portions of the leads 1.2 to 1.4. The die pad may be disposed so that it is exposed to the lower main face of the package 1 adjacent to the insulation layer 5.

It should, however, be mentioned at this stage that the present disclosure is not restricted to a TO package and that also other types of semiconductor packages can be used.

The semiconductor package 1 as depicted in FIG. 1 can be a power package in which, for example, the semiconductor die is comprised of a power transistor like, for example, an insulated gate bipolar transistor (IGBT). The semiconductor die can be mounted with one of its contact pads onto the die pad and the die pad can be exposed to the outside at a lower main face of the semiconductor package 1. For this reason an insulation layer 5 is applied to the lower main face of the semiconductor package 1. The insulation layer 5 can be any type of electrically insulating and thermally conducting layer like, for example, a layer comprising a thermal interface material (TIM).

The semiconductor package 1 comprises a first upper main face and a second lower main face, wherein when being mounted to a heatsink, the second lower main face will be adjacent to the heatsink which will be shown later. The clip 2 comprises a first portion 2.1 disposed above and at least in part connected with the first main face of the semiconductor package 1, a second portion 2.2 disposed above and at least in part connected with the second main face of the semiconductor package 1, and a bent portion 2.3 connecting the first and second portions 2.1 and 2.2. The first portion 2.1 of the clip 2 comprises a first through-hole 2.4, and the second portion 2.2 of the clip 2 comprises a second through-hole 2.5, wherein the first and second through-holes 2.4 and 2.5 are aligned with each other so that the screw 3 extends through both through-holes 2.4 and 2.5 and an end of the screw 3 is configured to make a fixed connection with the external heatsink which will be shown later.

The first portion 2.1 of the clip 2 comprises a horizontal section 2.11 which is directly connected with the first main face of the semiconductor package 1 by, for example, soldering, bonding, or gluing. The horizontal section 2.11 is connected with a portion of the first main face which is located above an area of the semiconductor package 1 in which a maximum of heat is generated like, for example, an area in which a power transistor is located. Moreover, the clip 2 may be formed in such a way that it provides a spring effect due to which the horizontal section 2.11 is pressed downwards and presses the semiconductor package 1 down onto the heatsink. The whole semiconductor package 1 is pressed downwards, but the pressure force is strongest in the area down from the horizontal section 2.11. In this way the heat generated in the power transistor can be dissipated in a most efficient way.

According to an example of the electronic module of FIG. 1, the screw 3 is a captive screw which means that it is fixed to the clip in a way that it cannot be removed, at least not easily or only by use of force or by damaging the clip or the screw itself.

According to the example of the electronic module as shown in FIG. 1, the clip 2 comprises the second portion 2.2 which covers the lower main face of the semiconductor package 1, essentially for protecting the insulation layer 5. However, it is not absolutely necessary to protect the insulation layer 5 so that the clip 2 can also have another form as will be shown in the following example.

Figure 2:
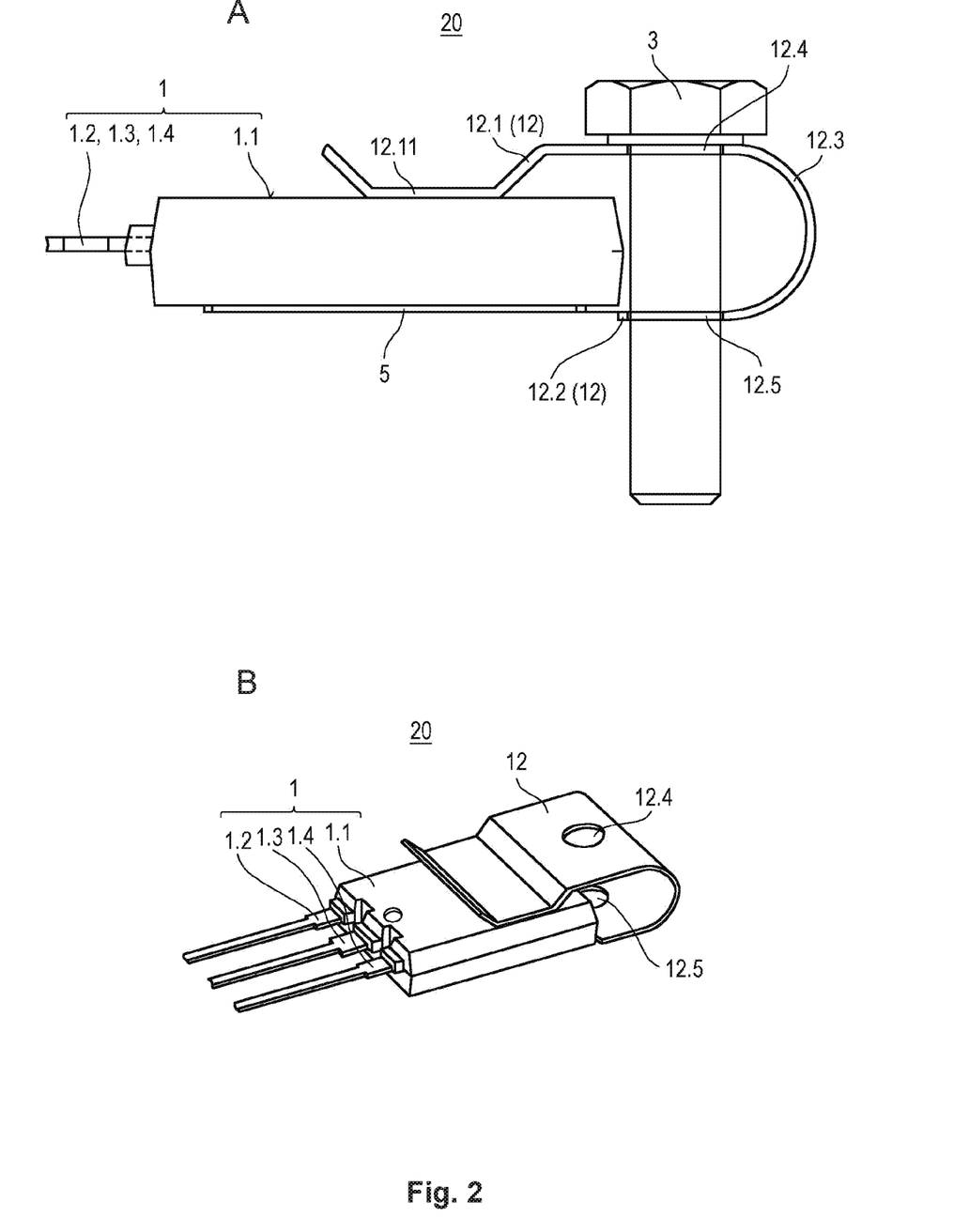
FIG. 2 shows a schematic cross-sectional side view (A) and a perspective view (B) of an example of an electronic module similar to the example of FIG. 1, but in which example the clip does not extend underneath the semiconductor package.

FIG. 2 shows a schematic cross-sectional side view (A) and a top view (B) of an example of an electronic module. The electronic module 20 of FIG. 2 is similar to the example of FIG. 1, so that the same reference numerals have been used for similar elements the description of which will not be repeated here. The only element which is different from FIG. 1, is the clip 12. The clip 12 of FIG. 2 comprises a first portion 12.1, a horizontal section 12.11, a bent portion 12.3, and first and second through-holes 12.4 and 12.5 which are similar to the respective parts of the clip 2 of FIG. 1. Only the second portion 12.2 is different in that it does not extend underneath the semiconductor package 1 and does not cover the insulation layer 5. For different reasons a decision can be made that the insulation layer 5 does not need protection by the clip as in the case of FIG. 1. For example, it can be that the material of the insulation layer 5 is chosen such that it does not need to be protected. It can also be that the die pad is located above the lower main face of the package so that the encapsulant underneath the die pad provides the electrical insulation. In other words, in such a case the die pad is completely embedded in the encapsulant. Examples thereof will be shown and explained later in connection with FIGS. 8 and 10.

The electronic module 20 can be fabricated by performing fabrication steps of die attach, encapsulation and clip trimming (other method steps may be added as, for example, forming front side interconnects between leadframe and die, in particular by wire bonding or clip attaching etc.). For example, a leadframe comprising at least one die pad and lead elements can be provided. Thereafter one or more semiconductor dies are attached to the one or more die pads. A clip can be provided which is initially in the form of a flat sheet of spring steel. Then the assembly consisting of the leadframe and the mounted semiconductor die(s) is attached to a portion of the clip which is to become the second portion 2.2. Thereafter an encapsulation step is performed by embedding the leadframe and the semiconductor die(s) by means of, for example, transfer molding. Thereafter a clip which is to become the first portion 2.1 is bent back so that the two through-holes 2.4 and 2.5 are aligned and the horizontal section 2.11 is connected with the first main face of the semiconductor package 1. Finally the screw is put through the through-holes 2.4 and 2.5, in particular in such a way that it is captively connected to the clip 2.

Figure 3:
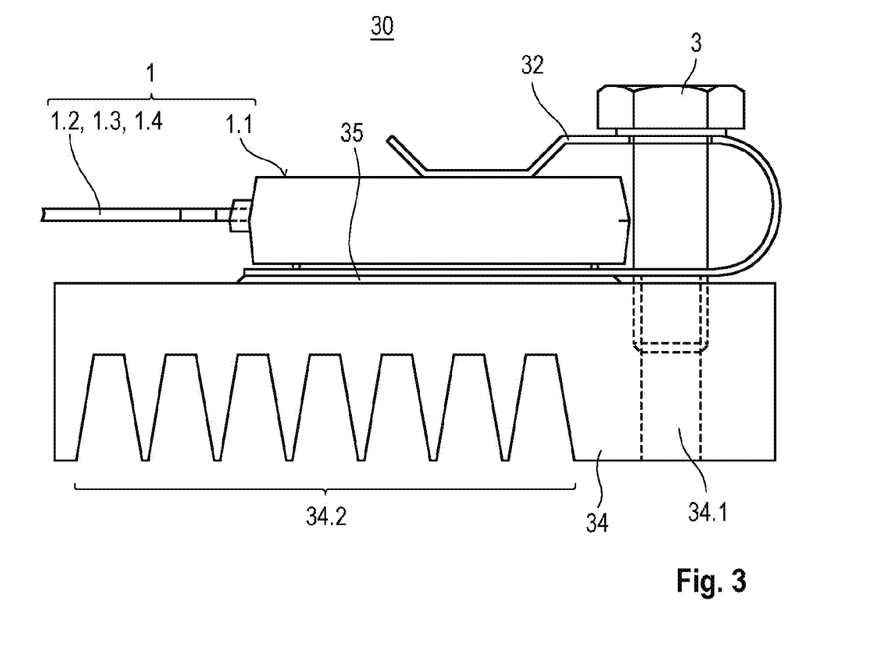
FIG. 3 shows a schematic cross-sectional side view representation of an assembly of an electronic module according to FIG. 1 mounted onto a heatsink, wherein a TIM layer is provided between the clip and the heatsink.

FIG. 3 shows a schematic cross-sectional side view of an assembly of an electronic module mounted onto a heatsink. The electronic module 30 comprises a semiconductor package 1 such as that shown and described in connection with FIG. 1, so that the same reference numerals have been used for similar elements the description of which will not be repeated here. The electronic module 30 further comprises a clip 32 which is similar to the clip 2 of FIG. 1. The electronic module 30 is mounted onto a heatsink 34 which comprises a bore 34.1 suitable for receiving the screw, and a fin structure 34.2. A TIM layer 35 can be provided between the clip 32 and the heatsink 34 for improving the heat transfer to the heatsink 34.

Figure 4:
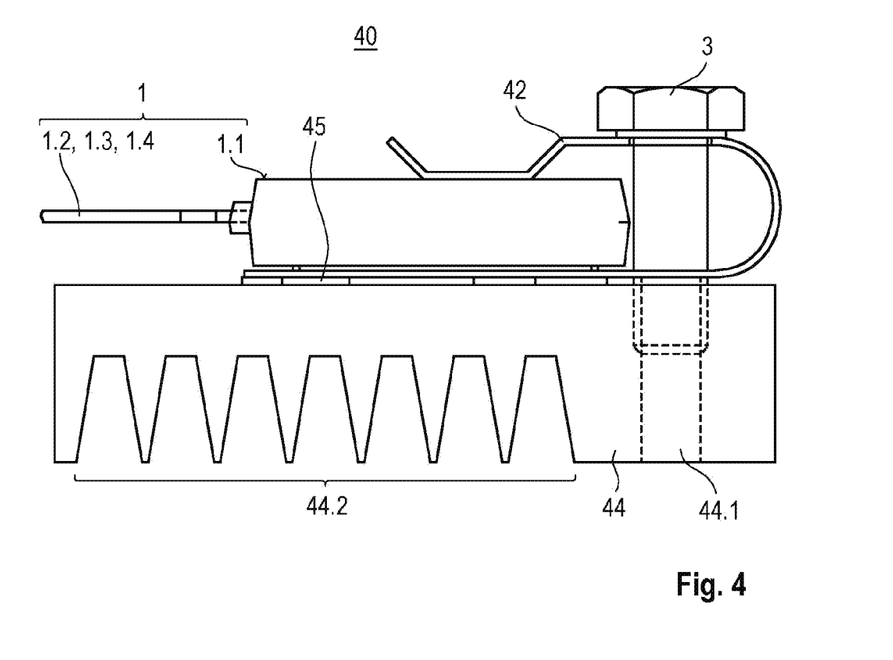
FIG. 4 shows a schematic cross-sectional side view representation of an assembly of an electronic module according to FIG. 1 is mounted onto a heatsink, wherein a phase change layer is provided between the clip and the heat sink.

FIG. 4 shows a schematic cross-sectional side view of an assembly of an electronic module mounted onto a heatsink. The electronic module 40 comprises a semiconductor package 1 such as that shown and described in connection with FIG. 1, so that the same reference numerals have been used for similar elements the description of which will not be repeated here. The electronic module 40 further comprises a clip 42 which is similar to the clip 2 of FIG. 1. The electronic module 40 is mounted on a heatsink 44 which comprises a bore 44.1 suitable for receiving the screw 3, and a fin structure 44.2. A phase-change layer 45 is provided between the clip 42 and the heatsink 44 for improving the heat transfer to the heatsink 44.

Figure 5:
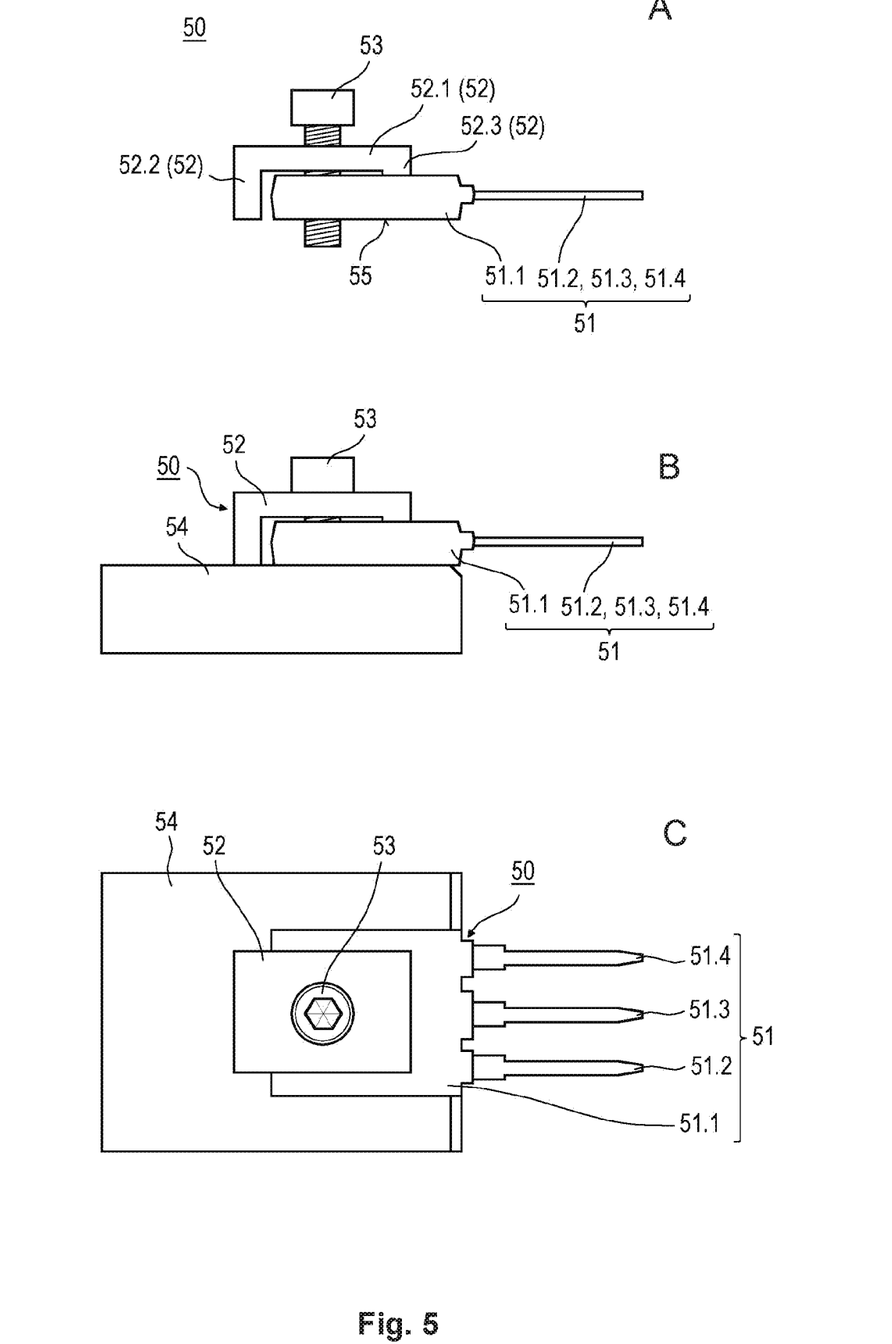
FIG. 5 shows a schematic cross-sectional side view (A) of an example of an electronic module in which example the semiconductor package comprises a through-hole and the clip comprises a through-hole and the fastening element extends through both through-hole and thereby connects the semiconductor package to the clip, a side view (B) showing the electronic module mounted onto a heatsink, and a top view (C).

FIG. 5 shows a cross-sectional side view (A), a side view (B) and a top view (C) of an example of an electronic module. As shown in perspective A, the electronic module 50 comprises a semiconductor package 51, a clip 52 connected to the semiconductor package 51, and a screw 53 connected to the clip 52 and configured to connect the semiconductor package 51 and the clip 52 to an external heatsink 54 as can be seen in perspectives B (side) and C (top).

The semiconductor package 51 is again a TO package and can in principle be similar to the semiconductor package 1 as was shown and described in the examples of FIGS. 1 to 4, wherein the semiconductor package 51 comprises a die pad (not shown), a semiconductor die (not shown), pins 51.2, 51.3, and 51.4, and an encapsulant 51.1. The semiconductor package 51 differs from the semiconductor package 1 in that it comprises a through-hole for connecting it with the clip 52. The clip 52 itself comprises a through-hole and the through-hole of the clip 52 and the through-hole of the semiconductor package 51 are aligned with each other. The screw 53 extends through both through-holes and an end of the screw 53 is configured to make a connection with the external heatsink 54.

The semiconductor package 51 comprises a first main face remote from the external heatsink 54, and a second main face opposite to the first main face and adjacent to the external heatsink 54, wherein the clip 52 comprises an essentially horizontal portion 52.1 disposed above the first main face, a first vertical portion 52.2 connected with one end of the horizontal portion and extending along a side face of the semiconductor package 51, and a second vertical portion 52.3 connected with an opposite end of the horizontal portion 52.1 and connected with the first main face of the semiconductor package 51. The through-hole of the clip 52 is formed in the horizontal portion 52.1 of the clip 52.

The second vertical portion 52.3 can be arranged so that it is connected with a portion of the first main face of the semiconductor package 51 which is located above a portion of the semiconductor package 51 in which a maximum of heat is generated, in particular above a portion in which a semiconductor (power) transistor die is located. In this way such a portion of the semiconductor package 51 can be pressed with a maximum pressure to the heatsink 54.

For insulation purposes an insulation layer 55, in particular a TIM layer, can be applied to the second main face of the semiconductor package 51 adjacent to the heatsink 54, wherein the insulation layer 55 comprises a through-hole for the screw 53 to reach through and make connection with the heatsink 54.

Figure 6:
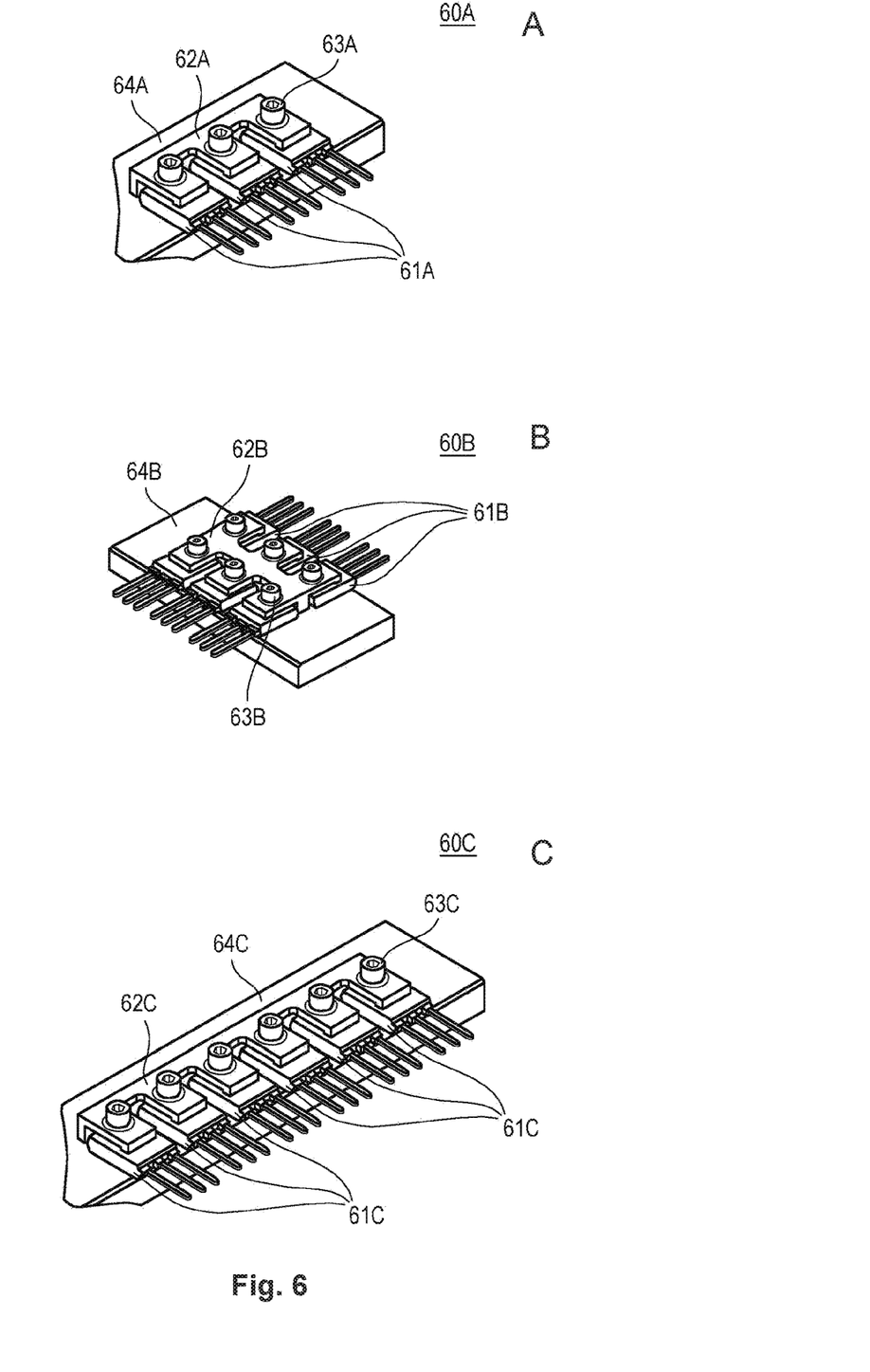
FIG. 6 shows perspective views of electronic modules in which a clip is constructed so as to mount a plurality of semiconductor packages to a heatsink, three packages in a row (60A), six packages with three packages on two opposing sides (60B), and six packages in a row (60C).

FIG. 6 shows examples of electronic modules 60A, 60B, 60C in which a clip is constructed so as to mount a plurality of semiconductor packages to a heatsink.

Electronic module 60A contains three semiconductor packages arranged in a row. Each one of the semiconductor packages 61A can be of the same type as the semiconductor package 51 as was shown and described in connection with FIG. 5. The electronic module 60A further comprises a clip 62A which can be similar to the clip 52 of FIG. 5 while the clip 62A comprises three horizontal portions each one of which comprising a through-hole with a screw 63A inserted in the through-hole for pressing down the semiconductor packages 61A onto a heatsink 64A.

Electronic module 60B contains six packages with three packages arranged on two opposing sides, respectively. Each one of the semiconductor packages 61B can be of the same type as the semiconductor package 51 as was shown and described in connection with FIG. 5. The electronic module 60B further comprises a clip 62B which can be similar to the clip 52 of FIG. 5 while the clip 62B comprises six horizontal portions with three horizontal portions arranged on two opposing sides and each one of which comprising a through-hole with a screw 63B inserted in the through-hole for pressing down the semiconductor packages 61B onto a heatsink 64B.

Electronic module 60C contains six packages in a row. Each one of the semiconductor packages 61C can be of the same type as the semiconductor package 51 as was shown and described in connection with FIG. 5. The electronic module 60C further comprises a clip 62C which can be similar to the clip 52 of FIG. 5 while the clip 62C comprises three horizontal portions each one of which comprising a through-hole with a screw 63C inserted in the through-hole for pressing down the semiconductor packages 61C onto a heatsink 64C.

Figure 7:
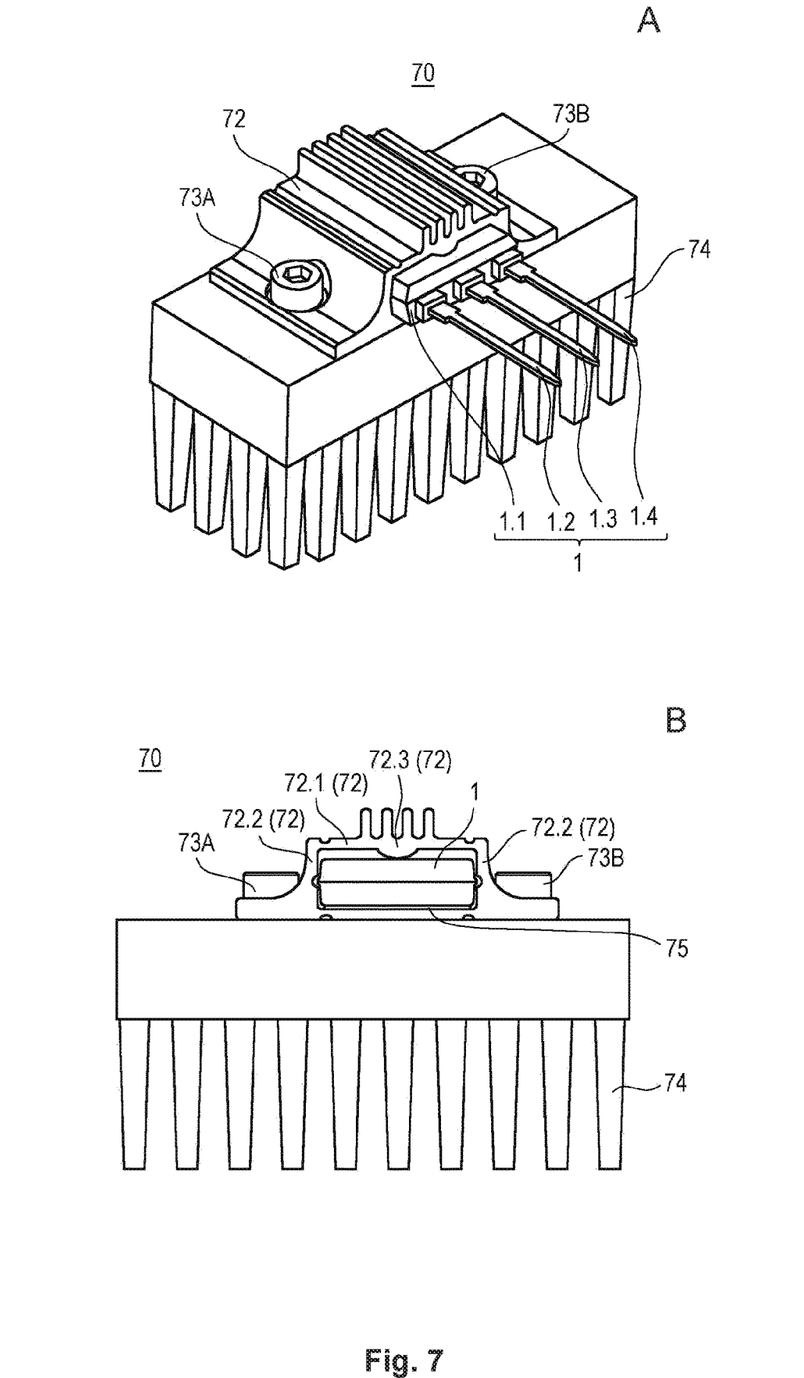
FIG. 7 shows a schematic perspective view (A) and a side view (B) of an example of an electronic module in which example the clip comprises a central portion disposed above the semiconductor package, and two further portions symmetrically extending essentially along side faces of the semiconductor package.

FIG. 7 shows a schematic perspective view (A) and a side view (B) of an example of an electronic module. The electronic module 70 of FIG. 7 is shown in a state where it is mounted to an external heatsink 74 which is not part of the electronic module 70. The electronic module 70 comprises a semiconductor package 1, a clip 72 connected to the semiconductor package 71, and two screws 73A and 73B connected to the clip 72 and configured to connect the semiconductor package 1 and the clip 72 to the external heatsink 74. The semiconductor package 1 of FIG. 7 can be similar to the semiconductor package 1 of FIGS. 1 to 4, so that the description of which will not be repeated here and the same reference numerals of its parts have been used for similar elements.

The clip 72 comprises a central essentially horizontal portion 72.1 disposed above the semiconductor package 1, and two side portions 72.2 symmetrically extending essentially along side faces of the semiconductor package 1. Each one of the side portions 72.2 of the clip 72 comprises a through-hole at a bottom part thereof and each one of the two screws 73A and 73B extends through one of the through-holes to make a connection with the external heatsink 74. The heatsink 74 comprises two bores which are disposed and configured so as to receive the two screws 73A and 73B.

The central portion 72.1 of the clip 72 has a plate-like structure wherein most part of the plate is spaced from the upper main face of the semiconductor package 1 in a state where the electronic module 70 is mounted to the heatsink 74. The central portion 72.1 further comprises a small protuberance 72.3 which extends downwards from a lower face of the central portion 72.1 and in a mounted state is pressed onto the upper main face of the semiconductor package 1. The protuberance 72.3 is shown to in the center of the central portion 72.1, but in general can be located so that it presses the semiconductor package 1 on an area in which the heat is generated, i.e. above the semiconductor (power) transistor.

As shown in FIG. 7, the central portion 72.1 of the clip 72 may further comprise a fin structure on its upper face in order to improve the heat dissipation to the outside.

Figure 8:
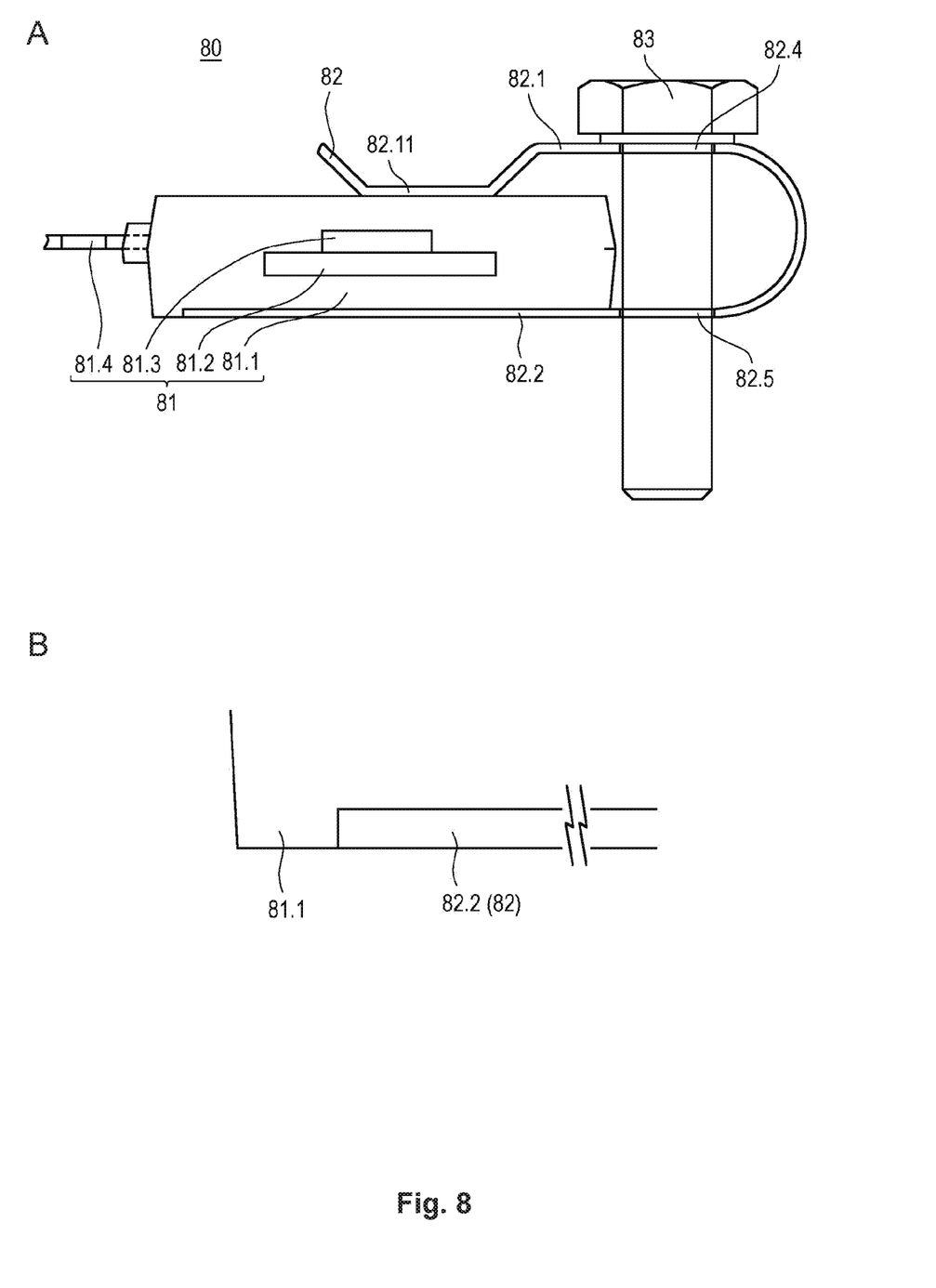
FIG. 8 shows a schematic cross-sectional side view representation of an electronic module with an embedded clip (A) and a left lower cutout of the electronic module (B).

FIG. 8 shows an example of an electronic module in a cross-sectional side view. The electronic module 80 of FIG. 8 comprises a semiconductor package 81, a clip 82 and a screw 83 connected with the clip 82. The semiconductor package 81 comprises an encapsulant 81.1, a die pad 81.2, a semiconductor die 81.3 disposed on the die pad 81.2, and external leads 81.4 wherein one of the external leads 81.4 may be connected with the die pad 81.2. The clip 82 comprises two aligned through-holes 82.4 and 82.5 and an upper portion 82.1 comprising a lower horizontal section 82.11 the function of which has been explained above. As can be seen in this example, the die pad 81.2 is not exposed to the outside of the semiconductor package 81. Therefore this electronic module 80 does not comprise an insulation layer as the foregoing examples. Instead the encapsulant 81.1 below the die pad 81.2 functions as electrical insulation and furthermore the encapsulant 81.1 may be configured thermally conducting which can be achieved, e.g. by appropriate filler materials as was outlined above.

A feature of the electronic module 80 is that a portion 82.2 of the clip 82 is embedded in the encapsulant 81.1. As can be seen in view B, the clip 82 is covered at its upper main face and its left-hand side face by the encapsulant 81.1. A lower main face of the portion 82.2 may then be coplanar with the lower main face of the encapsulant 81.1. The electronic module 80 can be fabricated by performing successive fabrication steps of die attach, encapsulation and clip trimming. For example, a leadframe comprising the die pad and the external leads 81.4 can be provided. Thereafter the semiconductor die is attached to the die pad. The clip 82 will be provided which is initially in the form of a flat sheet of spring steel. The clip 82 is in an appropriate position relative to the leadframe and then an encapsulation step is performed by embedding the leadframe, the semiconductor die, and the clip 82 by means of, for example, transfer molding. Thereafter a right-side clip portion is bent back so that the two through-holes 82.4 and 82.5 are aligned and the horizontal section 82.11 is connected with the first main face of the semiconductor package 81. Finally the screw 83 is put through the through-holes 82.4 and 82.5, in particular in such a way that it is captively connected to the clip 82.

Figure 9:
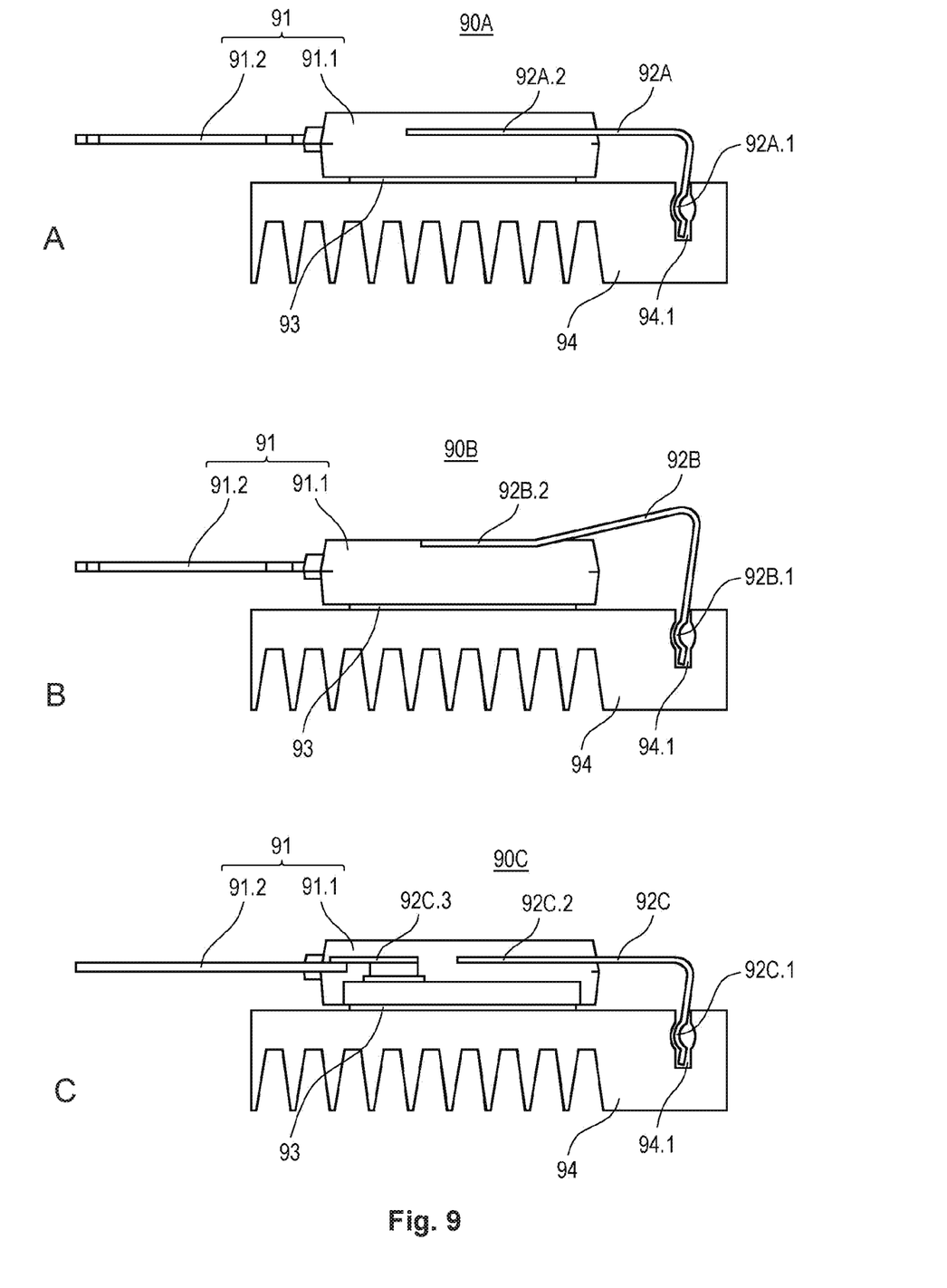
FIG. 9 shows a schematic cross-sectional side view representation of an electronic module with an embedded clip comprising an integrated fastening element wherein a portion of the clip is fully embedded (A), partially embedded (B), and fully embedded and further comprising a die front side interconnect (C).

FIG. 9 shows schematic cross-sectional side view representations of an electronic module with an embedded clip comprising an integrated fastening element. In view A, a portion of the clip is completely embedded. In view B, a portion of the clip is partially embedded. In view C, a die front side interconnect is provided. Returning to view A, the electronic module 90A comprises a semiconductor package 91 and a clip 92A connected to the semiconductor package 91. The semiconductor package 91 comprises an encapsulant 91.1, a die pad (not shown), a semiconductor die (not shown) disposed on the die pad, external leads 91.2 wherein one of the external leads 91.2 may be connected with the die pad, and an insulation layer 93 disposed at the lower main face of the encapsulant 91.1. The electronic module 90A is shown mounted onto an external heatsink 94.

A feature of the electronic module 90A is that the clip 92A comprises a fastening element 92A.1 which serves for fastening the clip 92A and thereby the semiconductor package 91 to the external heatsink 94. The external heatsink 94 comprises an appropriate recess 94.1 in an upper surface thereof which recess 94.1 is formed in such a way that the fastening element 92A.1 can engage into the recess 94.1 to result in a fixed connection between the clip 92A and the external heatsink 94.

A further feature of the electronic module 90 is that a portion 92A.2 of the clip 92 is embedded in the encapsulant 91.1. As can be seen in view A, the portion 92A.2 is completely embedded by the encapsulant 91.1 which means that upper and lower main faces and the left-hand side face of the portion 92A.2 are covered by the encapsulant 91.1.

View B of FIG. 9 shows another example of an electronic module 90B which is comparable with the example of view A but in which a portion 92B.2 of a clip 92B is only partially embedded in the encapsulant 91.1. The upper main surface of the clip 92B is exposed to the outside which would allow, for example, attaching a further external heatsink and thereby further improve heat dissipation. Everything else of the electronic module 90B in view B is similar or equal to the electronic module 90A in view A of FIG. 9. Also the fastening element 92B.1 in view B can be similar or equal to the fastening element 92A.1 in view A of FIG. 9.

View C of FIG. 9 shows a schematic cross-sectional side view representation of an electronic module with a fully embedded clip which further comprises a semiconductor die front side interconnect. The electronic module 90C in view C of FIG. 9 is thus comparable with the example in view A of FIG. 9 but wherein the clip 92C comprises a further portion 92C.3 which serves as a front side interconnect for the semiconductor die which means that the further portion 92C.3 electrically connects a contact pad on the upper first main face of the semiconductor die with one of the leads 91.2. The further portion 92C.3 is electrically isolated from the other portions of the clip 92C. The example as shown in view C of FIG. 9 illustrates that the clip 92C can also be fabricated from a leadframe which initially comprises a contiguous configuration and during processing is separated into two or more portions electrically isolated from each other. In general it is possible to start with two leadframes, namely one for fabricating the die pad and the leads and the other one for producing the clip and possibly the front side interconnect. However, it is also possible to start with only one leadframe for producing the die pad, the leads, the clip, and possibly the front side interconnect.

Figure 10:
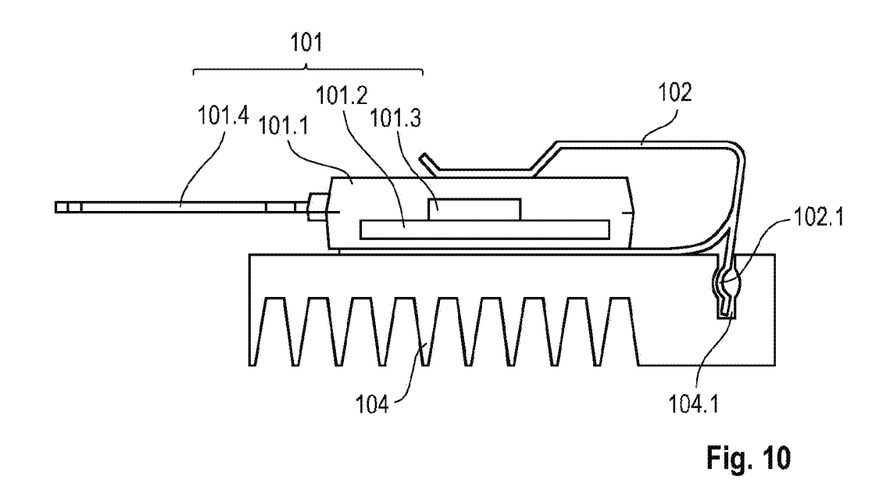
FIG. 10 shows a schematic cross-sectional side view representation of an electronic module with a clip comprising an integrated fastening element and a protection feature.

FIG. 10 shows an example of an electronic module in a cross-sectional side view. The electronic module 100 of FIG. 10 comprises a semiconductor package 101 and a clip 102 connected to the semiconductor package 101. The semiconductor package 101 comprises an encapsulant 101.1, a die pad 101.2, a semiconductor die 101.3 disposed on the die pad 101.2, and external leads 101.4 wherein one of the external leads 101.4 may be connected with the die pad 101.2. As can be seen in this example, the die pad 101.2 is not exposed to the outside of the semiconductor package 101 like in the example of FIG. 8. Therefore this electronic module 100 does not comprise an insulation layer as some the foregoing examples. The encapsulant 101.1 covers the upper main face of the clip 102 may be configured thermally conducting which can be achieved, e.g. by appropriate filler materials as was outlined above. The electronic module 100 is shown mounted onto an external heatsink 104.

A feature of the electronic module 100 is that the clip 102 comprises a fastening element 102.1 which serves for fastening the clip 102 and thereby the semiconductor package 101 to the external heatsink 104. The external heatsink 104 comprises an appropriate recess 104.1 in an upper surface thereof which recess 104.1 is formed in such a way that the fastening element 102.1 can engage into the recess 104.1 to result in a fixed connection between the clip 102 and the external heatsink 104.

The present disclosure is also related to a clip according to a further aspect. A clip according to the further aspect comprises at least one through-hole. It may have the form of the clip 52 as shown and described in connection with FIG. 5. It may alternatively have the form of the clip 2 as shown and described in connection with FIG. 2. A screw 3 or 53 may be captively connected to the clip 2 or 52. Also a TIM layer or other electrically insulating but thermally conducting layer may be deposited onto a main face of the clip which is supposed to be connected with a heat sink.

The present disclosure is also related to an electronic module comprising a semiconductor package and a clip connected to the semiconductor package and connectable to or comprising at least one fastening element which is configured to make a connection to an external heatsink, i.e. an electronic module which does not necessarily contain the fastening element so that the fastening element will be applied on the customer's side.

Figure 11:
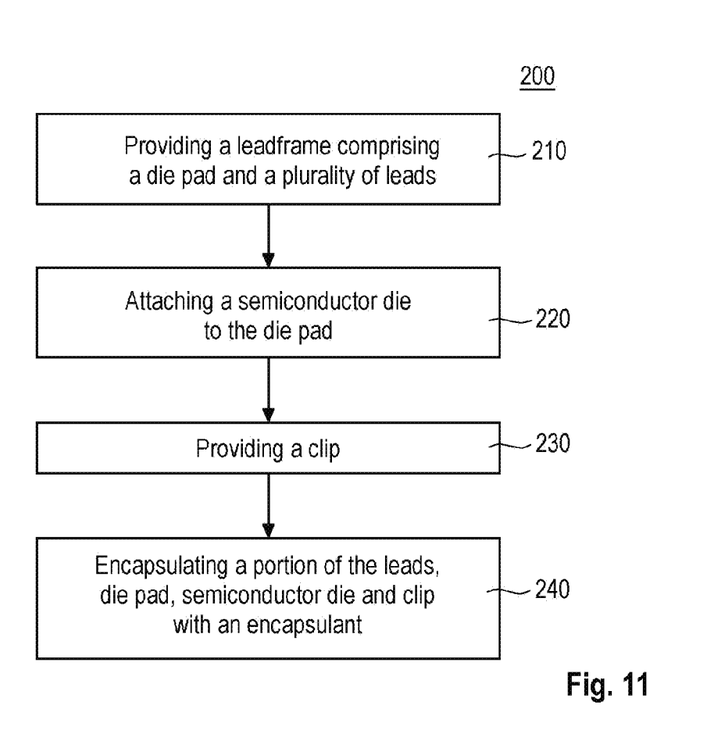
FIG. 11 shows a flow diagram of an example of a method for fabricating an electronic module.

FIG. 11 shows a flow diagram of an example of a method for fabricating an electronic module. The method 200 of FIG. 11 comprises providing a leadframe comprising a die pad and a plurality of leads (210), attaching a semiconductor die to the die pad (220), providing a clip (230) connectable to or comprising at least one fastening element, and encapsulating a portion of the leads, the die pad, the semiconductor die, and the clip with an encapsulant (240). The clip is either connectable to a fastening element like a screw, or comprises a fastening element which formed integral with the clip.

According to an example of the method of FIG. 11, a portion of the clip is partially or completely embedded in the encapsulant. Partial embedding means that the portion of the clip is covered by the encapsulant as shown, for example, in FIG. 8. Complete embedding means that the portion of the clip is covered by the encapsulant as shown, for example, in FIG. 9.

According to an example of the method of FIG. 11, the clip initially comprises the form of a flat sheet and is trimmed after encapsulating. In case of FIG. 8, for example, after the encapsulation step the portion of the clip which comprises the section 82.11, can be bent upwards and back and then connected with the upper main face of the package.

According to an example of the method of FIG. 11, the method is carried out in such a way that a plurality of electronic modules are fabricated in parallel in a batch process. In such a process a large frame containing a plurality of contiguous leadframes is provided and all method steps described before are carried out in parallel on each one of the leadframes.

In the following electronic modules and methods for fabricating electronic modules will be described by way of examples.

Example 1 is an electronic module comprising a semiconductor package, and a clip connected to the semiconductor package and connected to or comprising at least one fastening element which is configured to make a connection to an external heatsink.

Example 2 is an electronic module according to Example 1, wherein the fastening element comprises a screw, in particular a captive screw.

Example 3 is an electronic module according to Example 1, wherein the fastening element is formed integral with the clip.

Example 4 is an electronic module according to any one of the preceding Examples, wherein the clip comprises at least one through-hole in which the fastening element is inserted.

Example 5 is an electronic module according to Example 4, wherein the clip comprises one through-hole in which the screw is inserted.

Example 6 is an electronic module according to Example 5, wherein the semiconductor package comprises a through-hole and the screw is inserted in the through-hole of the clip and the through-hole of the semiconductor package.

Example 7 is an electronic module according to Example 4, wherein the clip comprises two through-holes in which the screw is inserted.

Example 8 is an electronic module according to any one of the preceding Examples, further comprising an insulation layer applied to a main face of the semiconductor package.

Example 9 is an electronic module according to anyone of the preceding Examples, wherein a portion of the clip is embedded in the encapsulant.

Example 10 is an electronic module according to Example 9, wherein the portion is partially or completely covered by the encapsulant.

Example 11 is an electronic module according to anyone of the preceding Examples, wherein the clip comprises a portion which is disposed on a pre-determined location of the semiconductor package wherein the pre-determined location is disposed above a region of the semiconductor package in which a maximum of heat is generated.

Example 12 is an electronic module according to Example 11, further comprising a first leadframe comprising a die pad and a second leadframe comprising the clip.

Example 13 is a method for fabricating an electronic module, the method comprising providing a first leadframe comprising a die pad, attaching a semiconductor die to the die pad, providing a clip connectable to or comprising at least one fastening element, and encapsulating, the die pad, the semiconductor die, and the clip with an encapsulant.

Example 14 is a method according to Example 13, wherein a portion of the clip is partially or completely embedded in the encapsulant.

Example 15 is a method according to Example 13 or 14, wherein the clip initially comprises the form of a flat sheet and is trimmed after encapsulating.

Example 16 is a method according to any one of Examples 13 to 15, further comprising providing a second leadframe comprising a clip portion, wherein the clip is provided by trimming the clip portion after encapsulating.

Example 17 is a method according to Example 16, wherein the second leadframe comprises the clip portion and a frontside interconnect.

Example 18 is a method according to any one of the Examples 13 to 17, further comprising a plurality of leads, which are part of one or both of the first and second leadframes.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An electronic module, comprising:
   a semiconductor package;
   a clip connected to the semiconductor package, the clip comprising at least one fastening element which is configured to make a connection to an external heatsink; and
   wherein the semiconductor package comprises a semiconductor die and an encapsulant of electrically insulating material that encapsulates the semiconductor die,
   wherein a portion of the clip is completely embedded in the encapsulant,
   wherein the clip is electrically isolated from the semiconductor die by a portion of the encapsulant, and
   wherein the at least one fastening element is a curved bend in the clip that is dimensioned such that an end portion of the clip comprising the curved bend can be securely retained within a bulge of a trench in the external heatsink.

2. The electronic module of claim 1, wherein the at least one fastening element is formed integral with the clip.

* * * * *